United States Patent
Basker et al.

(10) Patent No.: US 9,570,298 B1
(45) Date of Patent: Feb. 14, 2017

(54) LOCALIZED ELASTIC STRAIN RELAXED BUFFER

(71) Applicant: International Business Machines Corporation, Armonk, NY (US)

(72) Inventors: Veeraraghavan S. Basker, Schenectady, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/963,356

(22) Filed: Dec. 9, 2015

(51) Int. Cl.
| | |
|---|---|
| *H01L 21/02* | (2006.01) |
| *H01L 21/8238* | (2006.01) |
| *H01L 29/161* | (2006.01) |
| *H01L 29/10* | (2006.01) |
| *H01L 27/092* | (2006.01) |

(52) U.S. Cl.
CPC ... *H01L 21/02667* (2013.01); *H01L 21/02532* (2013.01); *H01L 21/823807* (2013.01); *H01L 27/092* (2013.01); *H01L 29/1054* (2013.01); *H01L 29/161* (2013.01)

(58) Field of Classification Search
None
See application file for complete search history.

(56) References Cited

U.S. PATENT DOCUMENTS

| | | | |
|---|---|---|---|
| 7,338,834 B2 | 3/2008 | Clifton | |
| 7,348,186 B2 | 3/2008 | Yoshida | |
| 7,442,993 B2 | 10/2008 | Bedell | |
| 7,550,370 B2 | 6/2009 | Chen | |
| 7,612,365 B2 | 11/2009 | Clifton | |
| 7,785,993 B2 | 8/2010 | Pawlak | |
| 7,825,401 B2 | 11/2010 | Cody | |
| 7,977,147 B2 | 7/2011 | Clifton | |
| 9,040,382 B2 | 5/2015 | Lin | |
| 2002/0185686 A1* | 12/2002 | Christiansen | H01L 21/02378 257/347 |
| 2003/0218189 A1 | 11/2003 | Christiansen | |
| 2005/0236668 A1* | 10/2005 | Zhu | H01L 21/28035 257/347 |

(Continued)

*Primary Examiner* — Calvin Choi
(74) *Attorney, Agent, or Firm* — Daniel P. Morris, Esq.; Otterstedt, Ellenbogen & Kammer, LLP

(57) ABSTRACT

A strain relaxed buffer layer is fabricated by melting an underlying layer beneath a strained semiconductor layer, which allows the strained semiconductor layer to elastically relax. Upon recrystallization of the underlying layer, crystalline defects are trapped in the underlying layer. Semiconductor layers having different melting points, such as silicon germanium layers having different atomic percentages of germanium, are formed on a semiconductor substrate. An annealing process causes melting of only the silicon germanium layer that has the higher germanium content and therefore the lower melting point. The silicon germanium layer having the lower germanium content is elastically relaxed upon melting of the adjoining silicon germanium layer and can be used as a substrate for growing strained semiconductor layers such as channel layers of field-effect transistors.

12 Claims, 2 Drawing Sheets

(56) References Cited

U.S. PATENT DOCUMENTS

2013/0126493 A1* 5/2013 Bedell .................. B23K 26/364
219/121.85
2014/0151766 A1* 6/2014 Eneman .............. H01L 29/1054
257/288

* cited by examiner

LOCALIZED ELASTIC STRAIN RELAXED BUFFER

BACKGROUND

The present disclosure relates generally to the electrical, electronic and computer arts and, more particularly, to strain relaxed buffers suitable for growing channel regions of nFET and pFET devices and the fabrication of such buffers.

Various semiconductor devices benefit from the use of strain-relaxed buffer layers such as those comprising fully relaxed silicon germanium (SiGe). Strain-relaxed buffers (SRBs) can act as virtual substrates on which to grow semiconductor layers having lattice constants different from those of the original substrates, for example silicon (001). The SRBs can support strained or relaxed layers. The SRBs should be relaxed to help avoid the generation of crystal imperfections such as threading dislocations in the layer(s) grown thereon. Such defects are known to have deleterious effects on the properties of electronic and optoelectronic devices. The crystalline quality of a relaxed SiGe layer can be improved by, for example, growing compositionally graded buffer layers with a thickness of up to several micrometers. As the surface roughness of buffer layers obtained using such a technique may not be optimal, chemical mechanical polishing (CMP) may be necessary. Another technique used for fabricating a relaxed $Si_{1-x}Ge_x$ buffer having reduced levels of threading dislocations includes epitaxially depositing a pseudomorphic or nearly pseudomorphic $Si_{1-x}Ge_x$ layer on the surface of a silicon substrate, ion implanting atoms of a light element into the substrate, and annealing the substrate at a temperature above 650° C. Existing techniques for reducing threading dislocation (TD) density rely on plastic relaxation, which by definition works based on dislocation generation to relax the lattice mismatched crystals.

Exemplary devices that may be formed using strain-relaxed silicon germanium layers include fin-type field-effect transistors (FinFETs), metal oxide field effect transistors (MOSFETs), and strained silicon-based complementary metal oxide semiconductor (CMOS) devices. Some devices require silicon layers under tensile strain to enhance electron mobility. Other devices or elements thereof require semiconductor layers under compressive strain. The amount of strain on a silicon or silicon germanium layer grown epitaxially on a relaxed $Si_{1-x}Ge_x$ layer can be engineered by providing an atomic percentage of germanium within a selected range.

Strain relaxed buffer layers allow dual channel materials to be provided on the same substrate employed to fabricate integrated circuits including, for example, FinFET devices. Defect density at the surface of the buffer layers is, however, a challenge to the successful fabrication of such devices. A defect density of about $10^5$ cm$^{-2}$ can be obtained using state-of-the-art processes as described above.

BRIEF SUMMARY

Techniques are provided for avoiding the propagation of defects to the surfaces of strain relaxed buffer layers. Virtual substrates obtained through the use of such techniques are further provided.

In one aspect, an exemplary fabrication method includes obtaining a structure including a semiconductor substrate layer comprising silicon, a strained epitaxial first layer having the composition $Si_{1-x}Ge_x$ on the substrate layer, and a strained epitaxial second layer in direct contact with the first layer and having the composition $Si_{1-y}Ge_y$ wherein y is less than x, melting the first layer while the substrate layer and the second layer remain in a solid state, thereby causing elastic relaxation of the second layer, and recrystallizing the first layer following elastic relaxation of the second layer.

In another aspect, an exemplary semiconductor structure includes a semiconductor substrate layer, a recrystallized $Si_{1-x}Ge_x$ layer containing defects on the substrate layer, and a strain relaxed defect-free $Si_{1-y}Ge_y$ layer in direct contact with the recrystallized $Si_{1-x}Ge_x$ layer. The value of y is less than x.

Techniques as disclosed herein can provide substantial beneficial technical effects. By way of example only and without limitation, one or more embodiments may provide one or more of the following advantages:

Avoiding dislocation formation and resulting defect propagation to the surfaces of strain relaxed buffer layers;
  Enabling use of relatively thin strain relaxed buffer layers;
  Improving performance of electronic devices formed on strain relaxed buffer layers;

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a structure wherein a strain relaxed silicon germanium buffer is provided for subsequent growth of a strain-engineered semiconductor layer thereon.

FIGS. 1-4 depict a process flow for obtaining a strain relaxed SiGe buffer layer on which an epitaxial semiconductor layer can be grown. The structure 20 shown in FIG. 1 includes a substrate layer 22, a first $Si_{1-x}Ge_x$ layer 24, and a second $Si_{1-y}Ge_y$ layer 26. The substrate layer 22 is a crystalline silicon layer in one exemplary embodiment. The substrate layer 22 can be a surface portion of a bulk silicon substrate or a silicon layer (SOI layer) of silicon-on-insulator substrate. Bulk silicon substrates may be preferred for some embodiments. The substrate layer is essentially undoped and substantially monocrystalline in one or more embodiments. An electrically insulating layer such as a buried oxide (BOX) layer (not shown) adjoins the substrate layer 22 in embodiments where a SOI substrate is employed. Various methods of fabricating semiconductor-on-insulator (SOI) substrates are known, one of which is Separation-by-Implanted Oxygen (SIMOX), wherein oxygen ions are implanted into a single crystal silicon substrate to form a BOX film. Another method of forming an SOI substrate is through the SMART CUT® method and wafer bonding, wherein two semiconductor substrates with silicon oxide surface layers are bonded together at the silicon oxide surfaces to form a BOX layer between the two semiconductor substrates.

Figure 1:
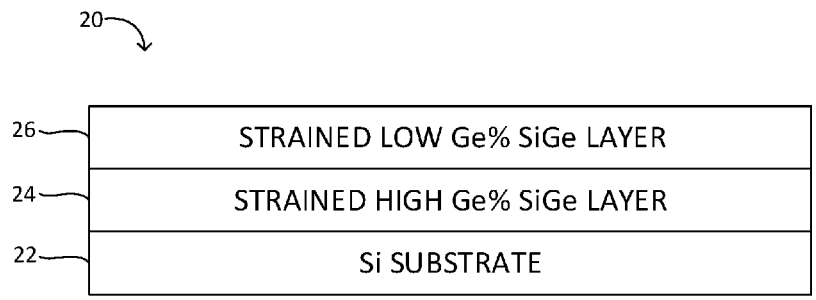
FIG. 1 is a schematic cross-sectional view of a structure including a pseudomorphic epitaxial layer of $Si_{1-x}Ge_x$ on a semiconductor substrate.

The exemplary structure 20 shown in FIG. 1 is obtained by growing a stack of pseudomorphic SiGe layers 24, 26 on the substrate layer 22. The layers are formed using any epitaxial growing process that allows the formation of SiGe layers having the desired pseudomorphic characteristics. In one or more embodiments, low pressure chemical vapor deposition (LPCVD) is employed to grow the SiGe layers. Such deposition can be conducted at 10-80 torr and between 600-1,000° C. In some alternative embodiments, an ultra-high-vacuum chemical vapor deposition (UHV-CVD) process may be employed to grow the SiGe layers on the substrate layer. For example, a UHV-CVD process is performed at low temperature (e.g. less than 550° C.) on a clean substrate layer surface in some embodiments. Other exemplary growth processes include molecular beam epitaxy (MBE), chemical beam epitaxy (CBE), chemical vapor deposition (CVD), and plasma-enhanced chemical vapor deposition (PECVD). In some embodiments, the ratio of silicon and germanium precursors (e.g. silane and germane) is maintained constant during epitaxial deposition to provide a substantially uniform ratio of silicon to germanium in each of the SiGe layers 24, 26. Ideally no defects are nucleated during growth of the layers. In one or more exemplary embodiments, the first $Si_{1-x}Ge_x$ layer 24 deposited on the surface of the substrate layer 22 has a value of x between 0.3 and 1 and the second $Si_{1-y}Ge_y$ layer 26 deposited on the first $Si_{1-x}Ge_x$ layer has a value of y between 0.1 and 0.4. The thickness of the first $Si_{1-x}Ge_x$ layer 24 may be between one and twenty-five nanometers (1-25 nm) and the thickness of the second (relatively low germanium content) layer 26 may be between twenty and one thousand nanometers (20-1,000 nm). In some embodiments, the second layer 26 is at least ten times thicker than the first layer 24. The melting point of silicon germanium is dependent on the concentration of germanium therein. As known in the art, silicon has a melting point that substantially exceeds the melting point of germanium. In a $Si_{1-x}Ge_x$ alloy, greater amounts of silicon (and less germanium) are characterized by higher melting points. The following formula has been used to approximate the melting point of silicon germanium alloys: $T_1 \approx (1412-80x-395x^2)$ ° C. by Stohr et al., Z. Anorg. Allgem. Chem. 241 (1954). As used herein, "melting point" refers to the temperature of which a solid may turn into a liquid, also known as "liquidus" for the binary SiGe alloy. There is accordingly a substantial difference in melting points between silicon germanium alloys having relatively high concentrations of germanium as compared to those having low germanium concentrations.

Figure 2:
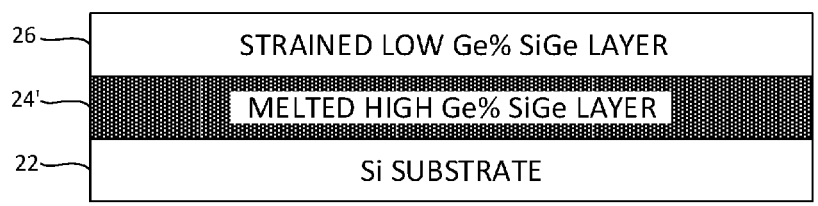
FIG. 2 is a cross-sectional view thereof schematically illustrating thermal annealing of the structure.

Referring to FIG. 2, the structure 20 is subjected to annealing, causing the first $Si_{1-x}Ge_x$ layer to melt while the adjoining layers 22, 26 remain solid. A substantial difference in the melting points of the two silicon germanium layers 24, 26, for example at least fifty degrees Centigrade (50° C.), helps ensure that only the first (bottom) layer 24 melts during the annealing process. The anneal temperature ramp up rate is preferably kept high to avoid any plastic relaxation of layer 26 during ramp up stage and prior to melting layer 24. The annealing duration is preferably kept short to avoid delaminating layer 26 after melting layer 24. Rapid thermal annealing (RTA), widely used in the semiconductor industry, has a typical ramp up rate of ~100° C./s and can facilitate plastic relaxation of the upper SiGe layer 26 during the ramp up. Laser and flash lamp annealing, which allow limiting elevated temperature processing to layer(s) near the substrate surface, is a preferred technique that may be employed. Such annealing has been employed to quickly raise surface layer temperatures followed by rapid cool-down. Millisecond-scale laser and flash annealing has ramp up rates in excess of 1,000,000° C./s and nanosecond-scale laser annealing has them in excess of 10,000,000,000° C./s. High temperature exposure times are in the range of tens of nanoseconds to milliseconds in one or more embodiments while the annealing temperature is greater than the melting point of the first SiGe layer 24 and less than that of the upper SiGe layer 26. In some exemplary embodiments, a pulsed nanosecond (100-250 nsec) laser anneal is employed. The bottom, high germanium percentage SiGe layer 24 is very thin as described above. Having a thickness of twenty-five nanometers or less in one or more exemplary embodiments, this layer 24 becomes molten when the structure 20 is subjected to laser annealing using pulsed nanosecond laser anneal tools. Nanosecond-scale laser annealing is highly preferred because it eliminates any possibility of plastic relaxation of layer 26 during ramp up stage. Laser annealing in the millisecond range or longer using, for example, a scanning millisecond laser anneal tool or a flash annealing tool, may also feasible for causing melting of the bottom SiGe layer 24. Rapid thermal anneal (RTA) processes, which conventionally heat substrates for half a second or longer, may or may not be feasible due to likely plastic relaxation of layer 26 during ramp up and possible delamination of the top SiGe layer 26 or other reasons, as discussed further below. The $Si_{1-x}Ge_x$ layer in the molten state is designated by numeral 24' in FIGS. 2 and 3.

Figure 3:
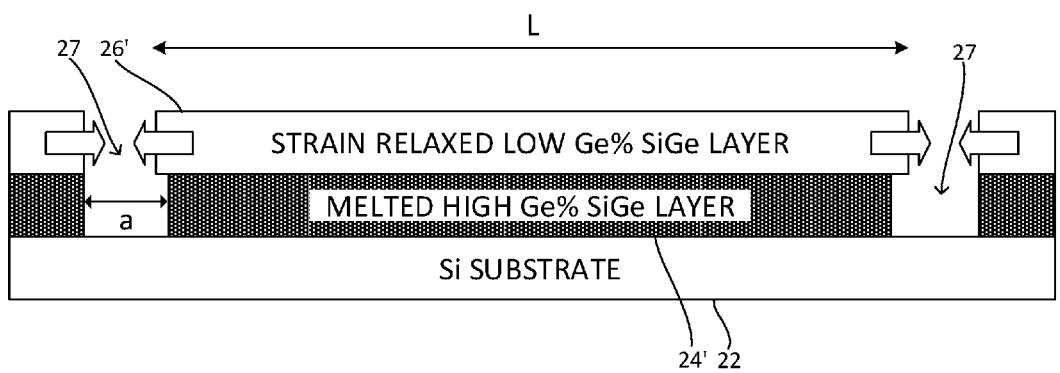
FIG. 3 is a further schematic, cross-sectional view thereof showing the relaxation of a $Si_{1-x}Ge_x$ layer having a relatively low atomic percentage of germanium.

As schematically illustrated in FIG. 3, the $Si_{1-y}Ge_y$ layer 26, which is under compressive strain, will elastically relax and expand laterally as a result of the melting of the high germanium content template (layer 24) that directly contacted its bottom surface. The strain relaxed, low germanium content SiGe layer formed from the strained $Si_{1-y}Ge_y$ layer 26 is designated by numeral 26'. The formation of a strain relaxed, low-germanium-content SiGe layer is facilitated by the presence of recesses 27 formed in the structure that ensure lateral expansion of the $Si_{1-y}Ge_y$ layer is not impeded. Trenches are formed in the structure, for example by reactive ion etching (ME), down to the silicon substrate layer 22 following patterning of a mask layer (not shown). ME etching of silicon germanium alloys can alternatively be conducted using HBr plasma, which provides highly directional anisotropic etching. Etching is discontinued upon or shortly after exposure of the top surface of the silicon substrate layer 22. The minimum widths "a" of the recesses 27 formed upon completion of the trenches are a function of the length L of the $Si_{1-y}Ge_y$ layer 26 prior to relaxation. The following formulas and values are applicable in one exemplary embodiment:

$L < \sim$velocity of elastic expansion*anneal(melt) time=$3e5$ cm/s*$1e$-$7$ sec=$300$ μm;

$a \sim$strain*$L$=$0.01$*$300$ μm=$3$ μm.

The lateral expansion of the top $Si_{1-y}Ge_y$ layer 26 upon melting of the underlying $Si_{1-x}Ge_x$ layer 24 occurs at a maximum velocity (Rayleigh wave velocity) that depends on its physical properties. Such expansion occurs during the time the $Si_{1-x}Ge_x$ layer 24 is molten. It is expected that the expansion of the top $Si_{1-y}Ge_y$ layer 26 will not exceed the speed of sound (in air). As an example, an expansion velocity of $3e5$ cm/s over an anneal time of one hundred nanoseconds ($1e$-$7$ seconds) provides a maximum length L between recesses 27 of the top $Si_{1-y}Ge_y$ layer 26 of about three hundred microns. The dimension "a" of the recesses 27 is sufficient to ensure the top $Si_{1-y}Ge_y$ layers 26 of adjoining areas of a wafer do not come into contact with each other as they expand. In exemplary embodiments having one percent strain and top $Si_{1-y}Ge_y$ layers 26 having lengths of three hundred microns, the minimum dimension of "a" is about three microns. The layers 26 expand in all directions, two of which are schematically shown in FIG. 3 by arrows. The strain relaxed layer shown in the center of FIG. 3 moves about one and one half microns (1.5 μm) into each recess 27 in the exemplary embodiment for a total lateral expansion of three microns. Assuming the adjoining $Si_{1-y}Ge_y$ layers 26 also have lengths L of three hundred microns, they also expand into the recess by about 1.5 μm. The recesses 27 have large enough dimensions that contact between adjacent layers as they expand is avoided. Such contact could potentially create unwanted defects in the strain relaxed layers 26'. The dimension "a" is very small relative to "L" using SiGe materials and the anneal times described above; the recesses 27 accordingly do not occupy a significant percentage of the wafer area and large areas are accordingly provided for electronic device formation.

The annealing time is an important consideration in the fabrication of the relaxed buffer layer. The $Si_{1-y}Ge_y$ layer 26 will elastically relax due to the loss of the underlying template once it is in the molten state, forming a defect-free buffer layer 26'. A relatively short anneal duration prevents the molten $Si_{1-x}Ge_x$ layer 24' from being displaced, possibly resulting in delamination of the $Si_{1-y}Ge_y$ layer 26 from the $Si_{1-x}Ge_x$ layer. Such delamination is possible if the duration of the $Si_{1-x}Ge_x$ layer in the molten state is beyond acceptable limits. Annealing times of less than one microsecond are employed in one or more embodiments, and are in a range of 100-250 microseconds in some embodiments. Displacement of the $Si_{1-x}Ge_x$ layer in the molten state could also adversely affect regrowth of the layer upon cooling, as described further below with respect to FIG. 4.

Figure 4:
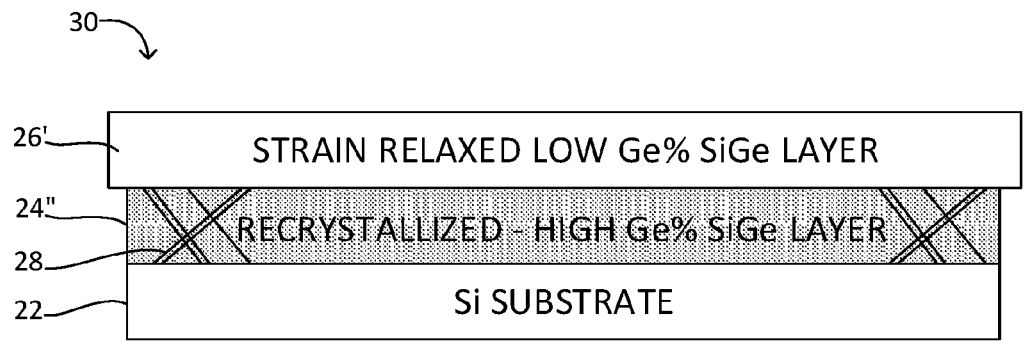
FIG. 4 is a cross-sectional view showing recrystallization of a $Si_{1-x}Ge_x$ layer having a relatively high atomic percentage of germanium.

Cooling of the structure results in recrystallization of the $Si_{1-x}Ge_x$ layer 24, forming a recrystallized $Si_{1-x}Ge_x$ layer 24" in direct contact with the strain relaxed layer 26' in the exemplary structure. Crystalline defects such as stacking faults and dislocations could be introduced during the recrystallization process, but are trapped in the recrystallized layer 24". Defects 28 are schematically illustrated within the recrystallized layer. The structure 30 as schematically illustrated in FIG. 4 is accordingly obtained. While chemical mechanical planarization (CMP) of the strain relaxed layer 26' is not necessarily required, the strain relaxed layer 26' has sufficient thickness (at least 100 nm) in one or more embodiments to enable surface touch-up using CMP. By avoiding displacement of the $Si_{1-x}Ge_x$ layer in the molten state, cooling of the $Si_{1-x}Ge_x$ layer starts at its interface with the much thicker substrate layer 22. Regrowth of the $Si_{1-x}Ge_x$ layer accordingly occurs substantially from the bottom of the layer towards the top, resulting in fewer defects than should regrowth originate from opposing sides of the layer or should the top and bottom portions of the layer cool with the same speed. The $Si_{1-y}Ge_y$ layer optionally includes dislocation-stopping feature(s) such as carbon-doped SiGe layer(s). The substrate layer 22, which may comprise a bulk silicon substrate, has a greater thickness than both the recrystallized $Si_{1-x}Ge_x$ layer and the strain relaxed $Si_{1-y}Ge_y$ layer in one or more exemplary embodiments to facilitate bottom to top regrowth of the $Si_{1-x}Ge_x$ layer. A silicon substrate layer having a thickness of at least several microns is employed in some embodiments, and therefor has a substantially greater thickness than the SiGe layers formed thereon.

Figure 5:
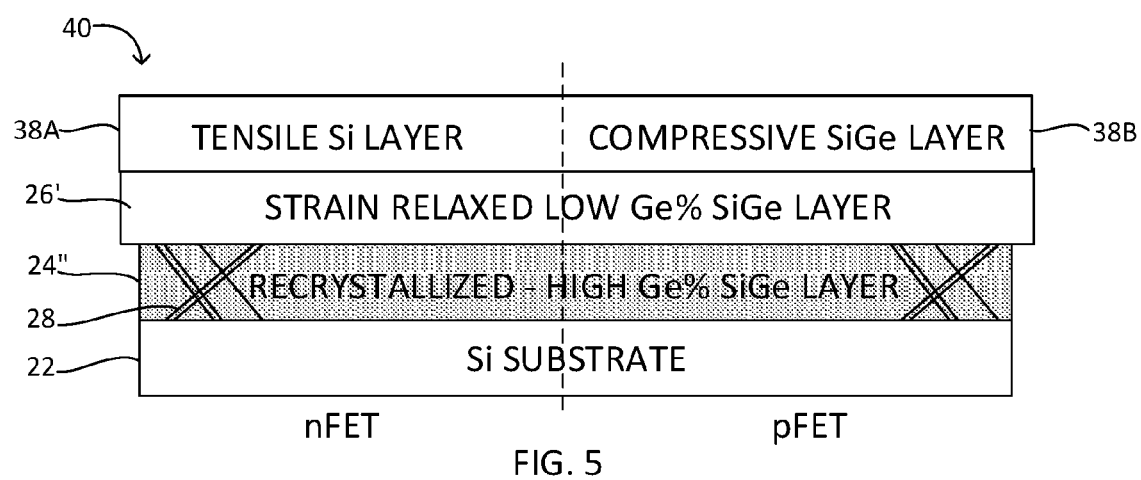
FIG. 5 is a schematic, cross-sectional view thereof showing strain-engineered epitaxial layers formed on the strain relaxed $Si_{1-x}Ge_x$ layer.

One or more semiconductor layers can be epitaxially grown on the strain relaxed layer 26' and used to form electronic devices such as field effect transistors. Areas of the structure, for example nFET and pFET regions, can be electrically isolated by forming shallow trench isolation regions (not shown). Some areas can be employed for forming nFET devices while other areas are used to form pFET devices. In some exemplary embodiments, dual channel FinFET devices are formed. Patterning techniques familiar to those skilled in the art facilitate trench formation and subsequent filling of the trenches with one or more electrically insulating material(s) such as silicon dioxide. The filling process can be done by any suitable deposition process (e.g., by CVD, spin-on) followed by removal of the oxide from areas other than the STI regions. CMP (chemical mechanical planarization) to the top of the strained $Si_{1-y}Ge_y$ layer 26 or an etch-back process can be employed to remove excess oxide from the structure. The shallow trench isolation (STI) process provides regions that electrically isolate active areas of the structure. As discussed above, tensile or compressive strain can be introduced into the channel regions of such electronic devices by growing semiconductor layers on the strain relaxed SiGe layer 26' having more or less germanium content than the strain relaxed SiGe layer 26'. Epitaxial $Si_{1-z}Ge_z$ layers are grown on the strain relaxed $Si_{1-y}Ge_y$ layer 26'. In embodiments wherein an epitaxial layer consists essentially of silicon (z=0), a tensile strained layer is obtained. In embodiments wherein z is greater than y, a compressively strained SiGe layer is obtained. As known in the art, compressively strained channels enhance the performance of PMOS devices while NMOS devices benefit from tensile strain. For example, a silicon layer 38A grown directly on an underlying relaxed SiGe layer undergoes tensile strain due to the larger lattice spacing of the SiGe layer. As further shown in FIG. 5, a compressively strained silicon germanium layer 38B can be epitaxially formed on the strain relaxed silicon germanium layer 26' in the pFET region of the structure 40.

FIGS. 1-5, as discussed above, depict exemplary processing steps/stages in the fabrication of exemplary structures including strain relaxed buffer layers. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in some integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary fabrication method includes obtaining a structure 20 including a semiconductor substrate layer 22 comprising silicon, a strained epitaxial first layer 24 having the composition $Si_{1-x}Ge_x$ on the substrate layer, and a strained epitaxial second layer 26 in direct contact with the first layer and having the composition $Si_{1-y}Ge_y$, wherein y is less than x so that the second layer has a higher melting point than the first layer. The method further includes melting the first layer 24 while the substrate layer and the second layer remain in a solid state, thereby causing elastic relaxation of the second layer. FIGS. 2-3 schematically illustrate such melting and relaxation, respectively. The first layer is recrystallized following relaxation of the second layer, as schematically illustrated in FIG. 4. In one or more embodiments, x is between 0.3 and 1.0, y is between 0.1 and 0.4, and each of the first and second layers has a substantially uniform (as opposed to graded) composition. The structure can be obtained by forming a substantially pseudomorphic epitaxial silicon germanium alloy layer having the composition $Si_{1-x}Ge_x$ directly on the substrate layer and forming a substantially pseudomorphic epitaxial silicon germanium alloy layer having the composition $Si_{1-y}Ge_y$ directly on the $Si_{1-x}Ge_x$ alloy layer. A high vacuum deposition technique may be employed to deposit the silicon germanium alloy layers. As shown in FIG. 3, recesses 27 extending through the SiGe layers facilitate elastic relaxation of the low germanium content $Si_{1-y}Ge_y$ layer 26 upon melting of the $Si_{1-x}Ge_x$ layer 24. The low germanium content $Si_{1-y}Ge_y$ layer expands laterally into the recesses during the elastic relaxation thereof. The recess widths are sufficient to facilitate lateral expansion of discrete portions of the second layer into the recesses without contacting each other during the elastic relaxation thereof. One or more embodiments further includes avoiding any plastic relaxation of the strained epitaxial second layer during a temperature ramp up stage preliminary to melting the first layer.

Given the discussion thus far, it will also be appreciated that an exemplary semiconductor structure is provided that includes a semiconductor substrate layer 22, a recrystallized $Si_{1-x}Ge_x$ layer 24" on the substrate layer, and an elastically strain relaxed defect-free $Si_{1-y}Ge_y$ layer 26' in direct contact with the recrystallized $Si_{1-x}Ge_x$ layer, the value of y being less than x. Elastic relaxation is characterized by the absence of defects in the layer 26'. The recrystallized $Si_{1-x}Ge_x$ layer 24", however, contains defects 28. In one or more embodiments, x is between 0.6 and 1.0 and y is between 0.1 and 0.4. In some embodiments, portions of the strain relaxed $Si_{1-y}Ge_y$ layer 26' are electrically isolated and a tensile silicon layer directly contacts an nFET region of the relaxed $Si_{1-y}Ge_y$ layer 26' and a silicon germanium layer under compressive strain directly contacts a pFET region of the relaxed $Si_{1-y}Ge_y$ layer 26'. In one or more embodiments, the recrystallized layer 24" has a thickness of less than twenty-five nanometers. The relaxed, defect-free layer 26' has a greater thickness than the recrystallized $Si_{1-x}Ge_x$ layer 24", and is at least ten times as thick as the recrystallized $Si_{1-x}Ge_x$ layer 24" in some embodiments. The substrate layer is thicker than the relaxed, defect-free layer 26' in one or more embodiments.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having electronic devices and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method comprising:
    obtaining a structure including a semiconductor substrate layer comprising silicon, a strained epitaxial first layer having the composition $Si_{1-x}Ge_x$ on the substrate layer, and a strained epitaxial second layer in direct contact with the first layer and having the composition $Si_{1-y}Ge_y$, wherein y is less than x;
    forming recesses extending through the first and second layers;
    melting the first layer subsequent to forming the recesses while the substrate layer and the second layer remain in a solid state, thereby causing elastic relaxation of the second layer and the second layer to expand laterally into the recesses during the elastic relaxation, and
    recrystallizing the first layer following elastic relaxation of the second layer.

2. The method of claim 1, wherein x is between 0.3 and 1.0, further including avoiding any plastic relaxation of the second layer during a temperature ramp up stage preliminary to melting the first layer.

3. The method of claim 2, wherein y is between 0.1 and 0.4.

4. The method of claim 1, wherein the strained, epitaxial first and second layers are pseudomorphic.

5. The method claim 1, wherein the strained, epitaxial first layer has a thickness between 3-25 nm.

6. The method of claim 1, wherein the strained, epitaxial second layer has a thickness between 20-1,000 nm and is thicker than the strained, epitaxial first layer.

7. The method of claim 1, further including causing a first one of the recesses to have a width sufficient to facilitate lateral expansion of a first portion of the second layer and a second portion of the second layer into the first one of the recesses without contacting each during the elastic relaxation thereof.

8. The method of claim 7, further including causing the first layer to remain in a molten state for a selected time and causing the distances between recesses to be proportional to the selected time in which the first layer is in the molten state.

9. The method of claim 1, wherein the melting point of the strained, epitaxial first layer is at least 50° C. less than the melting point of the strained, epitaxial second layer.

10. The method of claim 1, further including electrically isolating regions of the relaxed second layer, forming a tensile strained first semiconductor layer directly on an nFET region of the relaxed second layer and forming a compressive strained second semiconductor layer on a pFET region of the relaxed second layer.

11. The method of claim 1, wherein x is between 0.3 and 1.0, y is between 0.1 and 0.4, each of the first and second layers having substantially uniform compositions.

12. The method of claim 1, wherein obtaining the structure includes epitaxially depositing the first layer directly on the substrate layer and epitaxially depositing the second layer directly on the first layer.

* * * * *